US007964890B2

(12) United States Patent
Plössl et al.

(10) Patent No.: US 7,964,890 B2
(45) Date of Patent: Jun. 21, 2011

(54) EPITAXIAL SUBSTRATE, METHOD OF MAKING SAME AND METHOD OF MAKING A SEMICONDUCTOR CHIP

(75) Inventors: Andreas Plössl, Regensburg (DE); Gertrud Kräuter, Regensburg (DE); Rainer Butendeich, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 165 days.

(21) Appl. No.: 11/528,713

(22) Filed: Sep. 27, 2006

(65) Prior Publication Data
US 2007/0077744 A1 Apr. 5, 2007

(30) Foreign Application Priority Data

Sep. 30, 2005 (DE) .................. 10 2005 047 152

(51) Int. Cl.
H01L 33/00 (2010.01)
(52) U.S. Cl. ...... 257/103; 257/76; 257/79; 257/E33.002
(58) Field of Classification Search .................. 257/76, 257/79, 103; 438/42, 43
See application file for complete search history.

(56) References Cited

U.S. PATENT DOCUMENTS

| 4,625,226 | A  | * | 11/1986 | Antell ........................... 257/184 |
| 4,897,699 | A  | * | 1/1990  | Razeghi et al. ................. 257/13 |
| 5,854,090 | A  | * | 12/1998 | Iwai et al. ....................... 438/47 |
| 6,113,685 | A  |   | 9/2000  | Wang et al. |
| 6,277,696 | B1 | * | 8/2001  | Carey et al. ................... 438/289 |
| 6,420,242 | B1 |   | 7/2002  | Cheung et al. |
| 6,711,200 | B1 | * | 3/2004  | Scherer et al. ................. 372/64 |
| 7,109,527 | B2 |   | 9/2006  | Illek et al. |
| 7,244,630 | B2 | * | 7/2007  | Krames et al. ................ 438/47 |
| 2001/0050531 | A1 | * | 12/2001 | Ikeda ............................ 313/498 |
| 2003/0013223 | A1 | * | 1/2003  | Ramdani et al. ............... 438/46 |
| 2004/0234231 | A1 | * | 11/2004 | Nagao et al. .................. 385/147 |
| 2005/0116242 | A1 |   | 6/2005  | Behres et al. |
| 2005/0199901 | A1 |   | 9/2005  | Ueda |
| 2005/0239270 | A1 |   | 10/2005 | Fehrer et al. |

FOREIGN PATENT DOCUMENTS

| DE | 100 59 532 | 6/2002 |
| DE | 102 03 795 | 8/2003 |
| DE | 202 14 521 | 9/2003 |
| DE | 103 03 977 | 11/2003 |
| DE | 103 61 659 | 7/2005 |
| EP | 0987741    | 3/2000 |
| GB | 2 030 767  | 4/1980 |

OTHER PUBLICATIONS

EP search report, dated Jul. 3, 2008.
English Translation of Notification for the Opinion of Examination with regard to TW Application No. 95136153, dated Jun. 24, 2009.
S. Armbruster et al., "A Novel Micromachining Process for the Fabrication of Monocrystalline Si-Membranes using Porous Silicon", Robert Bosch GmbH, Reutlingen and Stuttgart-Gerlingen, Germany; IMTEK-Microsystem Materials Laboratory, University of Freiburg, Germany, (2003).
A.R. Clawson, "Guide to references on III-V semiconductor chemical etching", Materials Science and Engineering, vol. 21, pp. 1-438 (2001).

* cited by examiner

Primary Examiner — Lex Malsawma
Assistant Examiner — Robert Huber
(74) Attorney, Agent, or Firm — Fish & Richardson P.C.

(57) ABSTRACT

Proposed is an epitaxial substrate, particularly for making thin-film semiconductor chips based on III-V semiconductors, comprising a sacrificial layer that is applied to a wafer substrate and whose band gap is smaller than the band gap of the surrounding substrate, and a method of making the epitaxial substrate. Further described is a method of making a thin-film semiconductor chip, particularly an LED, wherein an epitaxial substrate is prepared, wherein at least one LED structure is grown on said epitaxial substrate and the LED structure is bonded to an acceptor substrate, and wherein the semiconductor wafer is released by at least partially destroying the sacrificial layer, and the at least one LED structure is singulated.

13 Claims, 3 Drawing Sheets

EPITAXIAL SUBSTRATE, METHOD OF MAKING SAME AND METHOD OF MAKING A SEMICONDUCTOR CHIP

CROSS REFERENCE TO RELATED APPLICATION

Pursuant to 35 U.S.C. §119, this application claims the benefit of German Application No. 10 2005 047 152.8, filed Sep. 30, 2005. The contents of the prior application is incorporated herein by reference in its entirety.

TECHNICAL FIELD

This application relates to an epitaxial substrate, particularly for making thin-film semiconductor chips based on III-V semiconductors, a method of making the epitaxial substrate, and a method of making a thin-film semiconductor chip, particularly an LED, a laser or an IR diode.

BACKGROUND

The use of thin-film semiconductor chips has been steadily gaining prevalence in recent years, especially in the production of radiation emitting components such as LEDs and lasers or IR diodes.

Such a thin-film semiconductor chip is described for example in DE 100 59 532. In its production, a light-emitting diode structure is grown on an epitaxial substrate and then bonded to an acceptor substrate, and the light-emitting diode structure is then separated from the epitaxial substrate. Heretofore, the method used to release the film, once it has been bonded to the acceptor substrate, has usually been to first thin the epitaxial substrate by grinding and then to remove the rest of the epitaxial substrate in an etching step. The original epitaxial substrate is completely destroyed in the process.

A further method of separating gallium nitride thin films is described in U.S. Pat. No. 6,420,242. In that method, a gallium nitride structure is deposited on a sapphire wafer, and this gallium nitride layer is bonded to an acceptor substrate and then heated by exposure to laser light. This heating causes local destruction of the crystal structure in the region of the gallium nitride. The release of gaseous nitrogen, combined with further heating to melt the residual gallium, causes the thin film to separate from the epitaxial substrate. However, this type of method has been practicable heretofore only in connection with the use of gallium nitride layers to fabricate thin-film chips, since heating gallium nitride layers permits the release of nitrogen in gaseous form.

SUMMARY

Disclosed herein are certain embodiments of a method that brings about an improvement in a cost-effective manner, and makes possible a separation technique that can be used with other material systems, particularly gallium arsenide based material systems.

In certain embodiments, the method is a semiconductor manufacturing method in which, a sacrificial layer is disposed on a wafer, said sacrificial layer possessing a band gap that is smaller than the band gap of the surrounding substrate. In particular, the band gap of the sacrificial layer is smaller than the band gap of the substrate crystal of the wafer.

If an epitaxial layer is applied above the sacrificial layer, the band gap of the sacrificial layer is particularly preferably smaller than the band gap of the epitaxial layer.

The wafer, in combination with the sacrificial layer, constitutes an epitaxial substrate. Such an epitaxial substrate is then irradiated with light, particularly laser light, whose wavelength is greater than the energy of the band gap of the wafer or of an epitaxial layer grown thereon, but is absorbed by the sacrificial layer. The sacrificial layer is selectively heated by this irradiation. The crystal structure of the sacrificial layer is destroyed in a targeted manner by this heating.

Since the products of decomposition are more absorptive than the surrounding material, this process can be carried out in self-limiting fashion.

As a result of certain embodiments disclosed herein, the wafer can be separated from other layers or structures that have been applied, for example with the aid of thin-film technology, in such a way that the wafer is not destroyed and can be reused.

The above-described irradiation of the sacrificial layer is preferably carried out at elevated ambient temperature, under vacuum, in water or in another medium. The products of decomposition can be kept from oxidizing prematurely at elevated temperature, can be removed from the parting layer more effectively under vacuum, can be dissolved out in water, or can be converted to hydride gas by means of hydrogen.

Certain embodiments provide that the wafer contains gallium arsenide or is composed primarily of gallium arsenide.

Certain embodiments provide that at least one epitaxial layer is disposed on the epitaxial substrate. The sacrificial layer is then disposed between the wafer and the epitaxial layer. Particularly preferably, the epitaxial layer has a material composition whose lattice constant matches that of the thin-film semiconductor chip structures to be deposited on it. The epitaxial layer further forms the base layer for the production of the thin-film semiconductor chip structure.

Certain embodiments preferably provide that the band gap of the sacrificial layer is smaller than the band gap of gallium arsenide. In the production of such gallium arsenide thin-film semiconductor chips, the band gap of the sacrificial layer should be smaller than the band gap of gallium arsenide, to permit targeted, selective heating with laser radiation.

A particularly preferred embodiment arises if the epitaxial substrate comprises at least one etch-stop layer. Particularly preferably, this etch-stop layer is disposed above or below the sacrificial layer. When such an etch-stop layer is used, after the process of releasing the thin-layer structure or the thin-film semiconductor chip, the newly created surface of the chip and the wafer can be cleansed of material residues of the sacrificial layer.

A further advantageous embodiment provides that the epitaxial substrate comprises at least one lattice-match layer. A lattice-match layer is arranged in a particularly advantageous manner between the sacrificial layer and the epitaxial layer resting thereon. Such a lattice-match layer reduces or eliminates the occurrence of lattice defects in the epitaxial layer, and thereby permits the selective growth of a thin-film semiconductor chip structure above the epitaxial layer.

A particularly preferred embodiment provides that the sacrificial layer contains Ge, GaAsN, GaAsSb or InGaAs. These materials are particularly suitable for forming a sacrificial layer within a gallium arsenide based semiconductor structure, their band gaps being smaller than the band gap of the surrounding gallium arsenide based semiconductor material.

A further particularly preferred embodiment arises if the sacrificial layer contains superlattices. Superlattice structures are particularly suitable for making it possible to perform or improve lattice-structure matching right in the sacrificial layer, and for improving the release properties upon the destruction of the sacrificial layer.

Another preferred embodiment provides that the sacrificial layer has a direct band gap. Using a direct band gap within the sacrificial layer improves the selectivity of the heating of the sacrificial layer in comparison to the other layer structures of the epitaxial substrate. With a direct band gap, there is no need for interaction with phonons for the irradiated photons in the sacrificial layer to be absorbed.

Another advantageous embodiment arises if the lattice structure of the sacrificial layer is matched to the lattice structure of the wafer. Matching the lattice structure of the sacrificial layer to the lattice structure of the wafer makes it possible to avoid the use of additional lattice structure matching layers.

A further advantageous embodiment arises if trenches or depressions extending in depth at least to the sacrificial layer are disposed on the growth side of the epitaxial substrate. Trenches of this kind facilitate the dissipation of any reaction products of the sacrificial layer during the process of separating the thin-film semiconductor chip structures from the wafer. The reaction products that occur in the separation process during the destruction or release of the sacrificial layer can be either gaseous or liquid reaction products. In particular, the release operation can be performed during laser exposure in a given atmosphere, for example a hydrogen atmosphere. The presence of a hydrogen atmosphere causes elements of the fifth main group to form compounds with hydrogen. These compounds are primarily gaseous. However, it is also possible to use other atmospheres to produce, for example, water-soluble reaction products, which can be dissolved in a humid environment and removed from the region of the sacrificial layer through the trenches.

A further preferred embodiment arises if at least one light-emitting diode structure, one laser structure or one IR diode structure is disposed on the epitaxial substrate. This structure, whichever it maybe, can be a component of the epitaxial layer or can alternatively be deposited above or on the epitaxial layer.

Another advantageous embodiment provides that a bonding layer, particularly a bonding layer for bonding to an acceptor substrate, is disposed on the at least one LED structure, laser structure or IR diode structure. By means of this bonding layer, the subsequent thin-film semiconductor chip structure can be firmly bonded to an acceptor substrate. Acceptor substrates serve a number of purposes in thin-layer technology. For example, the acceptor substrate is used to contact the thin-film semiconductor layer from the bottom, or the acceptor substrate is suitable for stabilizing the film in order to keep the thin-film semiconductor chip from being destroyed during the separation of the film from the epitaxial substrate.

A further preferred embodiment provides that epitaxial substrates according to the invention are used to produce LED, laser or IR diode thin-film chips.

To produce an epitaxial substrate according to certain embodiments, a sacrificial layer is advantageously applied to a wafer, particularly a gallium arsenide wafer.

However, the invention is not limited to the use of gallium arsenide wafers, but encompasses all types of wafers or substrates that contain gallium arsenide or are suitable for having gallium arsenide based epitaxial layers deposited on them.

A further advantageous embodiment provides that the sacrificial layer is overgrown with an epitaxial layer, which particularly preferably can comprise III-V semiconductors. Particularly preferably, these III-V semiconductors are gallium arsenide based III-V semiconductors, but all other types of III-V semiconductors are also feasible.

A further, particularly preferred embodiment provides that the sacrificial layer is structured. The structuring of the sacrificial layer can for example comprise the introduction of trench structures or depressions suitable for removing from the region of the sacrificial layer any reaction products that may be evolved during a subsequent separation step.

Another preferred embodiment provides that the method additionally comprises the step of structuring the epitaxial layer. Structuring the epitaxial layer is particularly suitable for removing evolved reaction products from the region of the sacrificial layer.

A further advantageous embodiment provides for making a thin-film LED chip, laser chip or IR diode chip by fabricating an epitaxial substrate and growing an LED, laser or IR diode structure on its surface, above the sacrificial layer, then bonding this LED, laser or IR diode structure to an acceptor substrate, releasing the underlying wafer or the underlying epitaxial substrate by means of laser light and subsequently singulating the LED, laser or IR diode structure grown on it into separate thin-film semiconductor chips.

DESCRIPTION OF DRAWINGS

Exemplary embodiments illustrated in the figures of the drawing follow. Elements of the same kind are provided with the same reference numerals. Therein.

DETAILED DESCRIPTION

Figure 1:
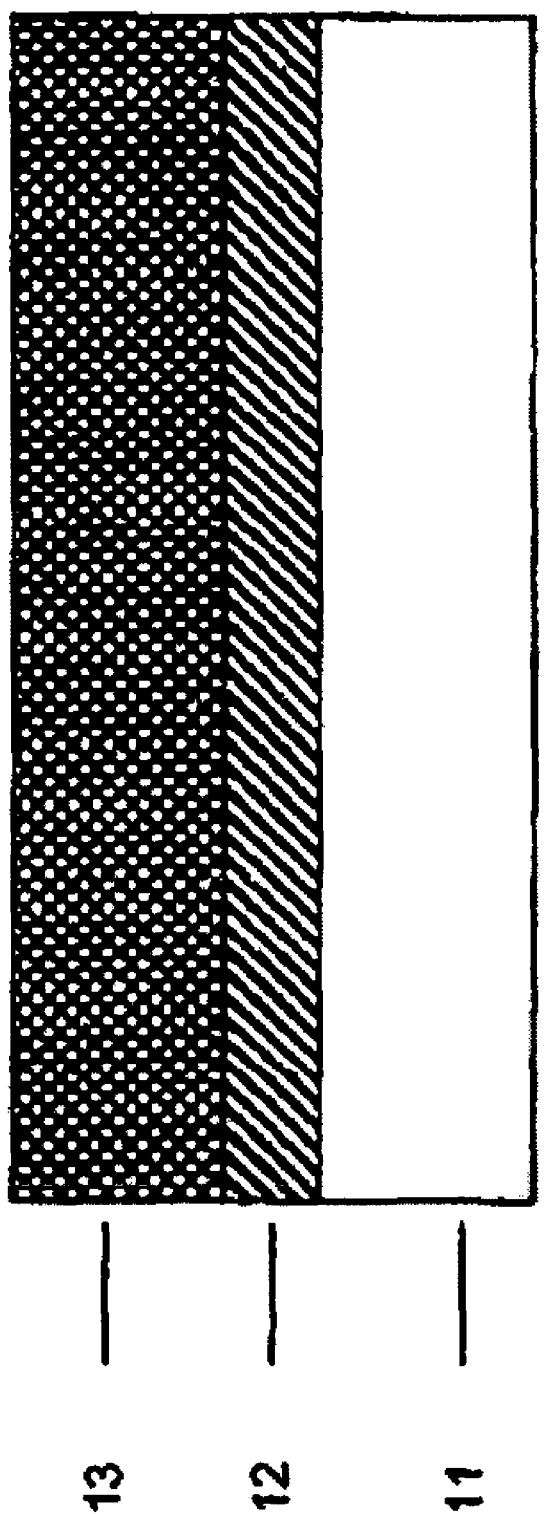
FIG. 1 is a schematic cross-sectional diagram of an epitaxial substrate according to the invention.

FIG. 1 is a schematic cross-sectional diagram of an epitaxial substrate according to the invention, in which a sacrificial layer 12 is applied to a wafer 11 composed primarily of III-V semiconductor material, particularly gallium arsenide, said sacrificial layer 12 comprising one or more of the materials Ge, GaAsN, GaAsSb and/or InGaAs. However, embodiments according to the invention are not limited solely to the use of sacrificial layers made of the aforesaid materials, but may comprise any material characterized by a band gap whose energy difference is smaller than the band gap of the wafer 11 or of the epitaxial layer 13 disposed on the sacrificial layer 12.

Figure 2:
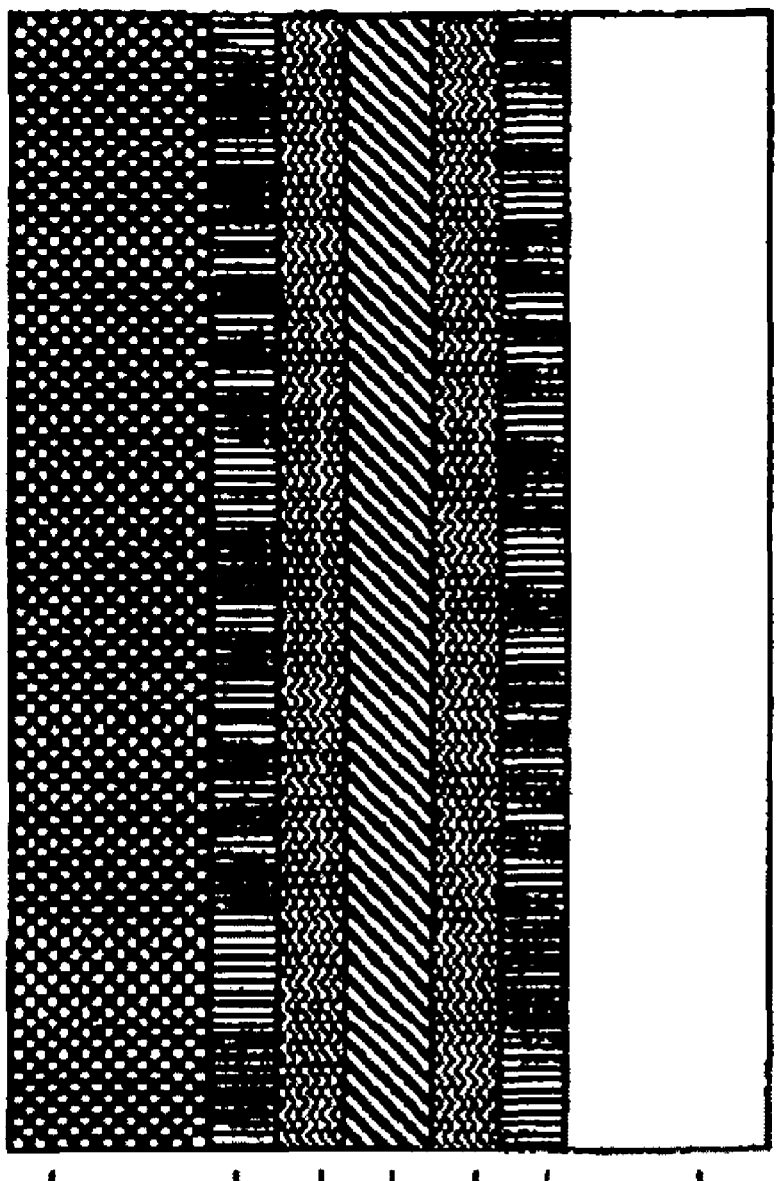
FIG. 2 is a further schematic diagram of an epitaxial substrate according to the invention.

FIG. 2 is a schematic cross-sectional diagram of a further advantageous embodiment. Disposed on a wafer 21 are an etch-stop layer 24a, a lattice-match layer 25a, a sacrificial layer 22, an additional lattice-match layer 25b, an additional etch-stop layer 24b and an epitaxial layer 23. The individual layers shown can also be arranged in a different order in further advantageous embodiments. The possible embodiments are not limited to the layers shown. Alternative embodiments can include either more or fewer layers.

The epitaxial layer 23 can serve as a base layer for the growth of LED, laser or IR diode structures or can also itself comprise LED, laser or IR diode structures. For example, etch-stop layers 24a, 24b and lattice-match layers 25a, 25b can be arranged on both sides of sacrificial layer 22 or on one side of sacrificial layer 22.

Figure 3:
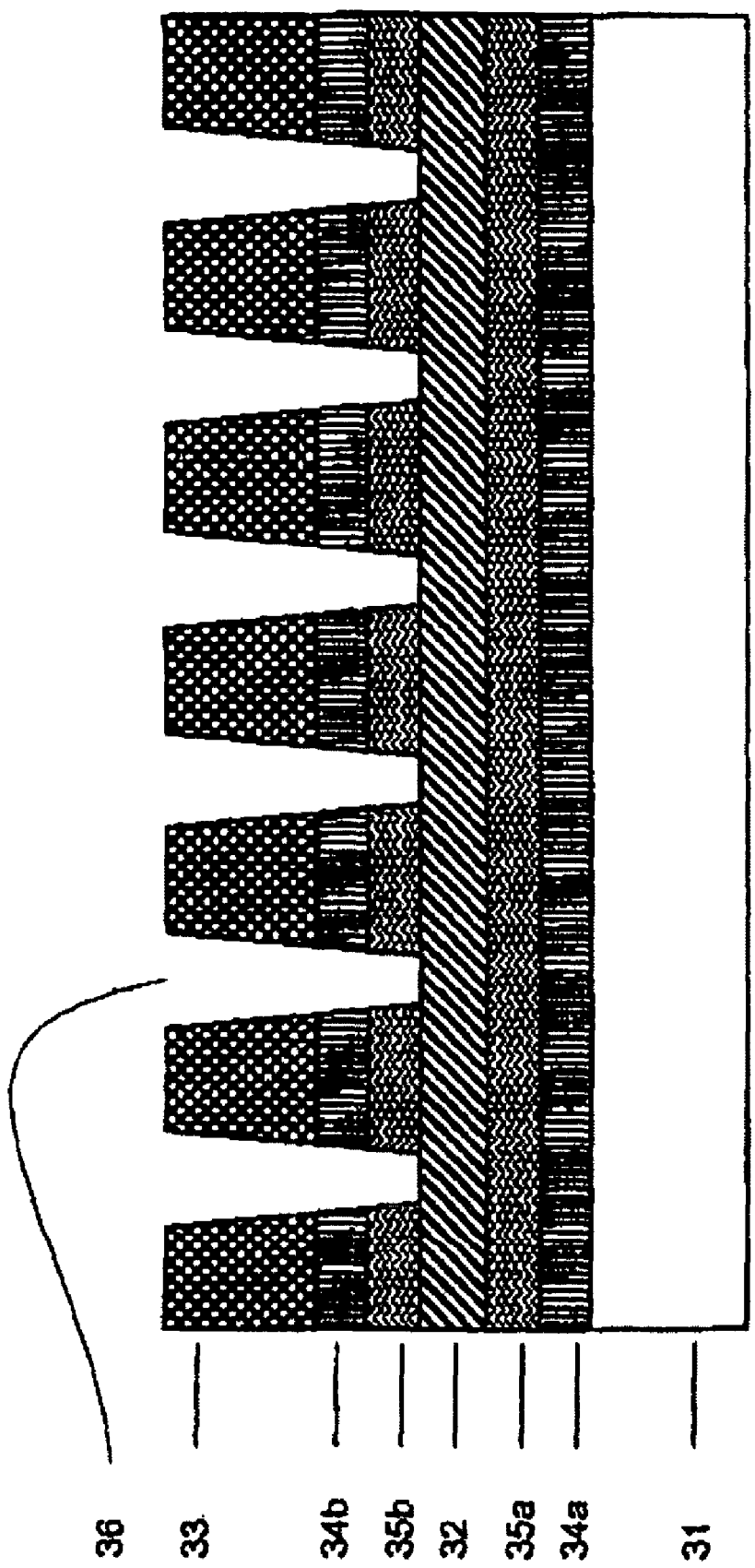
FIG. 3 is a further, preferred embodiment of an epitaxial substrate according to the invention with LED structures deposited thereon.

FIG. 3 shows a further advantageous embodiment of the invention. In this case, disposed on a wafer 31 are an etch-stop layer 34a, a lattice-match layer 35a, a sacrificial layer 32, an additional lattice-match layer 35b and an additional etch-stop layer 34b. Disposed thereabove is an epitaxial layer 33, which for example can itself contain LED structures or LED layers. Exemplary embodiments of epitaxial substrates according to the invention may, however, contain within the epitaxial layer 33 arbitrary additional thin-film, for example optoelectronic, structures, for example laser diode, laser or IR diode structures or sensor structures.

In this exemplary embodiment, viewed from the growth surface, depressions or trench-like structures are produced that extend to the sacrificial layer 32. These trench-like structures 36 serve to remove reaction products evolved during the process of releasing the sacrificial layer. In particularly preferred embodiments, in accordance with thin-layer technology, these trench structures 36 mark the regions in which, after the epitaxial layer 33 has been bonded to the stiffening carrier substrate or acceptor substrate and the growth substrate 31 has been removed, slicing is performed to effect singulation into plural thin-film semiconductor chips.

This patent application claims the priority of German Patent Application DE 10 2005 047 152.8, whose disclosure content is hereby incorporated by reference.

The invention is not limited to the exemplary embodiments by the description of it with reference thereto. Rather, the invention encompasses any novel feature and any combination of features, including in particular any combination of features recited in the claims, even if that feature or combination itself is not explicitly mentioned in the claims or exemplary embodiments.

What is claimed is:

1. A III-V-semiconductor-containing epitaxial substrate comprising:
   a wafer substrate comprising gallium arsenide;
   a sacrificial layer comprising at least one of Ge, GaAsN, GaAsSb and InGaAs, applied to the wafer substrate, and having a band gap smaller than the band gap of the wafer substrate;
   an epitaxial layer structure configured to emit radiation and applied to the sacrificial layer opposite to the wafer substrate;
   a first etch-stop layer between the wafer substrate and the sacrificial layer;
   a second etch-stop layer between the sacrificial layer and the epitaxial layer structure;
   a first lattice-match layer between the first etch-stop layer and the sacrificial layer; and
   a second lattice-match layer between the sacrificial layer and the second etch-stop layer, such that said lattice-match layers eliminate or reduce the occurrence of lattice defects in the epitaxial layer structure.

2. The epitaxial substrate as in claim 1, wherein a band gap of at least one epitaxial layer of the epitaxial layer structure is larger than the band gap of said sacrificial layer.

3. The epitaxial substrate as in claim 1, characterized in that said epitaxial substrate comprises at least one lattice-match layer.

4. The epitaxial substrate as in claim 1, characterized in that said sacrificial layer contains superlattices.

5. The epitaxial substrate as in claim 1, characterized in that said sacrificial layer has a direct band gap.

6. The epitaxial substrate as in claim 1, characterized in that the lattice structure of said sacrificial layer is matched to the lattice structure of said wafer.

7. The epitaxial substrate as in claim 1, characterized in that disposed on the growth side of said epitaxial substrate are trenches or depressions which extend in depth at least to said sacrificial layer.

8. The epitaxial substrate as in claim 1, characterized in that at least one light-emitting diode structure is disposed on said epitaxial substrate.

9. The epitaxial substrate as in claim 8, characterized in that disposed on said at least one LED structure is a bonding layer, particularly for bonding to an acceptor substrate.

10. An LED thin-film chip fabricated by means of an epitaxial substrate as in claim 1.

11. The epitaxial substrate of claim 1, wherein the epitaxial layer structure comprises a light emitting diode structure, a laser structure, or an infra red diode structure.

12. A III-V-semiconductor-containing epitaxial substrate comprising:
    a wafer substrate comprising gallium arsenide;
    a sacrificial layer comprising at least one of Ge, GaAsN, and GaAsSb, applied to the wafer substrate, and having a band gap smaller than the band gap of the wafer substrate;
    an epitaxial layer structure configured to emit radiation and applied to the sacrificial layer opposite to the wafer substrate;
    a first etch-stop layer between the wafer substrate and the sacrificial layer;
    a second etch-stop layer between the sacrificial layer and the epitaxial layer structure;
    a first lattice-match layer between the first etch-stop layer and the sacrificial layer; and
    a second lattice-match layer between the sacrificial layer and the second etch-stop layer, such that said lattice-match layers eliminate or reduce the occurrence of lattice defects in the epitaxial layer structure.

13. A III-V semiconductor-containing epitaxial substrate comprising:
    a wafer substrate comprising gallium arsenide;
    a sacrificial layer comprising at least one of Ge and GaAsSb, applied to the wafer substrate, and having a band gap smaller than the band gap of the wafer substrate;
    an epitaxial layer structure configured to emit radiation and applied to the sacrificial layer opposite to the wafer substrate;
    a first etch-stop layer between the wafer substrate and the sacrificial layer;
    a second etch-stop layer between the sacrificial layer and the epitaxial layer structure;
    a first lattice-match layer between the first etch-stop layer and the sacrificial layer; and
    a second lattice-match layer between the sacrificial layer and the second etch-stop layer, wherein said lattice-match layers eliminate or reduce the occurrence of lattice defects in the epitaxial layer structure.

* * * * *